US012677424B2

(12) United States Patent
Heo et al.

(10) Patent No.: US 12,677,424 B2
(45) **Date of Patent: *Jul. 7, 2026**

(54) THREE-DIMENSIONAL FERROELECTRIC MEMORY DEVICE

(71) Applicant: Samsung Electronics Co., Ltd., Suwon-si (KR)

(72) Inventors: Jinseong Heo, Suwon-si (KR); Taehwan Moon, Suwon-si (KR); Seunggeol Nam, Suwon-si (KR); Hyunjae Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 307 days.

This patent is subject to a terminal disclaimer.

(21) Appl. No.: 18/340,560

(22) Filed: Jun. 23, 2023

(65) Prior Publication Data

US 2024/0015983 A1 Jan. 11, 2024

(30) Foreign Application Priority Data

Jul. 5, 2022 (KR) ........................ 10-2022-0082764

(51) Int. Cl.
*H10B 53/20* (2023.01)
*G11C 11/22* (2006.01)
(Continued)

(52) U.S. Cl.
CPC ............ *H10B 53/20* (2023.02); *G11C 11/223* (2013.01); *H10B 51/20* (2023.02); *H10B 51/30* (2023.02); *H10B 53/30* (2023.02)

(58) Field of Classification Search
CPC ........ H10B 51/20; H10B 51/30; H10B 53/20; H10B 53/30; G11C 11/223
See application file for complete search history.

(56) References Cited

U.S. PATENT DOCUMENTS

| 10,636,471 B2 | 4/2020 | Ramaswamy et al. |
| 10,937,809 B1 | 3/2021 | Sharangpani et al. |
| (Continued) | | |

FOREIGN PATENT DOCUMENTS

| CN | 112470277 A | * | 3/2021 | ........... G11C 11/225 |
| CN | 117355142 A | * | 1/2024 | ......... H10D 30/0415 |
| (Continued) | | | | |

OTHER PUBLICATIONS

European Search Report and the European search opinion dated Nov. 3, 2023, issued in European Application No. 23183249.4.
(Continued)

*Primary Examiner* — Matthew E Warren
(74) *Attorney, Agent, or Firm* — HARNESS, DICKEY & PIERCE, P.L.C.

(57) ABSTRACT
A three-dimensional (3D) ferroelectric memory device may include a plurality of gate electrodes stacked on a substrate, a plurality of ferroelectric layers in contact with the plurality of gate electrodes, a plurality of intermediate electrodes in contact with the plurality of ferroelectric layers, a gate insulating layer in contact with the plurality of intermediate electrodes, and a channel layer in contact with the gate insulating layer. Widths of the intermediate electrodes may be greater than widths of the ferroelectric layers in contact with the intermediate electrodes.

20 Claims, 15 Drawing Sheets

(51) Int. Cl.
    *H10B 51/20*       (2023.01)
    *H10B 51/30*       (2023.01)
    *H10B 53/30*       (2023.01)

(56)         References Cited

U.S. PATENT DOCUMENTS

| | | |
|---|---|---|
| 11,171,157 B1 | 11/2021 | Lai et al. |
| 2019/0130957 A1 | 5/2019 | Müller |
| 2020/0303558 A1* | 9/2020 | Fujii ..................... H10B 43/27 |
| 2021/0358952 A1 | 11/2021 | Makala et al. |
| 2021/0398993 A1 | 12/2021 | Haratipour et al. |
| 2022/0036935 A1 | 2/2022 | Wang et al. |
| 2022/0059549 A1 | 2/2022 | Lai et al. |
| 2022/0139960 A1* | 5/2022 | Said ..................... H10D 30/701 |
| | | 257/295 |
| 2023/0371268 A1* | 11/2023 | Müller ................... H10B 51/20 |
| 2024/0172448 A1* | 5/2024 | Nam .................... H10D 30/701 |

FOREIGN PATENT DOCUMENTS

| | | | | |
|---|---|---|---|---|
| CN | 119183295 A | * | 12/2024 | ............. H10B 51/30 |
| KR | 2021/0135915 A | | 11/2021 | |
| WO | WO-2021236166 A1 | * | 11/2021 | ........... H10D 30/701 |

OTHER PUBLICATIONS

European Search Report and the European search opinion dated Nov. 2, 2023, issued in European Application No. 23183249.6.

European Office Action dated Aug. 1, 2025 for European Patent Application No. 23183249.4.

European Office Action dated Aug. 1, 2025 for European Patent Application No. 23183248.6.

Office Action dated Sep. 5, 2025 issued in U.S. Appl. No. 18/340,407.

Notice of Allowance dated Feb. 2, 2026 issued in U.S. Appl. No. 18/340,407.

* cited by examiner

THREE-DIMENSIONAL FERROELECTRIC MEMORY DEVICE

CROSS-REFERENCE TO RELATED APPLICATION

This application is based on and claims priority under 35 U.S.C. § 119 to Korean Patent Application No. 10-2022-0082764, filed on Jul. 5, 2022 in the Korean Intellectual Property Office, the disclosure of which is incorporated by reference herein in its entirety.

BACKGROUND

1. Field

The disclosure relates to a three-dimensional (3D) ferroelectric memory device.

2. Description of the Related Art

Hard disks according to the related art have been replaced with solid-state drives (SSDs), and thus NAND flash memory devices, which are nonvolatile memory devices, have been commercialized. Recently, due to the trend of compact sizes and high integration, a three-dimensional (3D) NAND flash memory device having a plurality of memory cells stacked in a perpendicular direction on a substrate has been developed.

In addition, research is currently in progress into the application of a ferroelectric field-effect transistor (FeFET), which has a low operating voltage and a high programming rate, to three-dimensional NAND flash memory devices.

SUMMARY

Provided are three-dimensional (3D) ferroelectric memory devices.

Additional aspects will be set forth in part in the description which follows and, in part, will be apparent from the description, or may be learned by practice of the presented embodiments of the disclosure.

According to an embodiment, a 3D ferroelectric memory device may include a substrate, a plurality of gate electrodes stacked on the substrate, a plurality of ferroelectric layers in contact with the plurality of gate electrodes, a plurality of intermediate electrodes in contact with the plurality of ferroelectric layers, a gate insulating layer in contact with the plurality of intermediate electrodes, and a channel layer in contact with the gate insulating layer. Widths of the plurality of intermediate electrodes may be greater than widths of the plurality of ferroelectric layers in contact with the plurality of intermediate electrodes.

In some embodiments, the plurality of gate electrodes may be stacked in a direction perpendicular to a surface of the substrate, and each of the plurality of gate electrodes may extend in a direction parallel to the surface of the substrate.

In some embodiments, the plurality of ferroelectric layers may be on upper surfaces of the plurality of the electrodes and lower surfaces of the plurality of gate electrodes, respectively. The upper surfaces of the plurality of gate electrodes and the lower surfaces of the plurality of gate electrodes may be parallel to the surface of substrate. The plurality of gate electrodes include may include first surfaces and second side surfaces that are different from each other. The plurality of ferroelectric layers may be on the first side surfaces of the plurality of gate electrodes, and the first side surfaces may be perpendicular to the surface of the substrate.

In some embodiments, areas of the plurality of ferroelectric layers in contact with the plurality of intermediate electrodes may be less than areas of the plurality of gate insulating layers in contact with the plurality of intermediate electrodes.

In some embodiments, the widths of the plurality of intermediate electrodes may be about 1.2 times to about 5 times the widths of the plurality of ferroelectric layers in contact with the plurality of intermediate electrodes.

In some embodiments, the widths of the plurality of intermediate electrodes may be about 15 nm to about 100 nm.

In some embodiments, each of plurality of the gate electrodes and each of the plurality of intermediate electrodes independently may include at least one of W, TiN, TaN, WN, NbN, Mo, Ru, Ir, RuO, IrO, and polysilicon.

In some embodiments, the 3D ferroelectric memory device may further include a plurality of first insulating layers between the plurality of gate electrodes.

In some embodiments, the plurality of first insulating layers may include at least one of SiO, SiOC, and SiON.

In some embodiments, the plurality of first insulating layers may have thicknesses of about 7 nm to about 100 nm.

In some embodiments, the plurality of ferroelectric layers may include a fluorite-based material, a nitride-based material, or perovskite.

In some embodiments, the plurality of ferroelectric layers may have thicknesses of about 3 nm to about 20 nm.

In some embodiments, the 3D ferroelectric memory device may further include a plurality of second insulating layers between the plurality of intermediate electrodes.

In some embodiments, insulating materials of the plurality of second insulating layers and the plurality of first insulating layers may be different from each other. The plurality of second insulating layers may include SiN.

In some embodiments, widths of the plurality of second insulating layers may be about 5 nm to about 20 nm.

In some embodiments, the gate insulating layer may include at least one of SiO, SiN, AlO, HfO, and ZrO.

In some embodiments, the channel layer may be provided in common to correspond to the plurality of gate electrodes.

In some embodiments, the channel layer may extend in a direction perpendicular to the substrate.

In some embodiments, the channel layer may include a Group IV semiconductor, a Group III-V semiconductor, an oxide semiconductor, a nitride semiconductor, an oxynitride semiconductor, a two-dimensional (2D) semiconductor material, quantum dots, or an organic semiconductor.

According to an embodiment, an electronic device including the 3D ferroelectric memory device described above may be provided.

According to an embodiment, a method of manufacturing a 3D ferroelectric memory device may include alternately stacking a plurality of first insulating layers and a plurality of sacrificial layers in a direction perpendicular to a surface of substrate; vertically forming channel holes to pass through the first insulating layers and the sacrificial layers; sequentially depositing an insulating material layer, a second insulating layer, a third insulating layer, and a channel layer on an inner wall of the channel holes; removing the plurality of sacrificial layers, and then exposing the second insulating layer by etching the insulating material layer; forming a plurality of recesses extending in a direction perpendicular to the surface of the substrate by etching the exposed second insulating layer; forming a plurality of intermediate electrodes to fill the plurality of recesses; depositing a plurality of ferroelectric layers on an inner wall of a space obtained by removing the plurality of sacrificial layers; and forming a plurality of gate electrodes in an inner portion of the plurality of ferroelectric layers.

In some embodiments, the method may further include, after the forming the channel layer on the inner wall of the channel holes, forming an oxide layer to fill the inside of the channel holes.

In some embodiments, widths of the intermediate electrodes in a direction perpendicular to the substrate may be greater than widths of the ferroelectric layers in contact with the intermediate electrodes.

In some embodiments, widths of the intermediate electrodes in the direction perpendicular to the substrate may be about 1.2 times to about 5 times the widths of the ferroelectric layers in contact with the intermediate electrodes.

In some embodiments, the first insulating layers may include at least one of SiO, SiOC, and SiON.

In some embodiments, the sacrificial layers may include SiN.

In some embodiments, the insulating material layer may include at least one of SiO, SiOC, and SiON.

In some embodiments, the second insulating layer may include SiN.

In some embodiments, the third insulating layer may include at least one of SiO, SiN, AlO, HfO, and ZrO.

In some embodiments, the channel layer may include a Group IV semiconductor, a Group III-V semiconductor, an oxide semiconductor, a nitride semiconductor, an oxynitride semiconductor, a 2D semiconductor material, quantum dots, or an organic semiconductor.

In some embodiments, the ferroelectric layers may include a fluorite-based material, a nitride-based material, or perovskite.

In some embodiments, each of the plurality of gate electrodes and each of the plurality of intermediate electrodes may independently include at least one of W, TiN, TaN, WN, NbN, Mo, Ru, Ir, RuO, IrO, and polysilicon.

According to an embodiment, a 3D ferroelectric memory device may include a substrate; a plurality of gate electrodes on a surface of the substrate and spaced apart from each other in a first direction, the first direction perpendicular to the surface of the substrate; a channel layer on the surface of the substrate and extending in the first direction; a plurality of intermediate electrodes spaced apart from each other on the surface of the substrate, the plurality of intermediate electrodes between the channel layer and the plurality of gate electrodes; a gate insulating layer between the plurality of intermediate electrodes and the channel layer; and a plurality of ferroelectric layers respectively on the plurality of plurality of gate electrodes and contacting the plurality of intermediate electrodes. The plurality of ferroelectric layers may be between the plurality of gate electrodes and the plurality of intermediate electrodes. The plurality of ferroelectric layers may be spaced farther apart from each other in the first direction than the plurality of intermediate electrodes are spaced apart from each other in the first direction.

In some embodiments, each of the plurality of gate electrodes and each of the plurality of intermediate electrodes independently may include at least one of W, TiN, TaN, WN, NbN, Mo, Ru, Ir, RuO, IrO, and polysilicon.

In some embodiments, the plurality of ferroelectric layers may include a fluorite-based material, a nitride-based material, or perovskite.

In some embodiments, the plurality of ferroelectric layers may have thicknesses of about 3 nm to about 20 nm.

In some embodiments, the 3D ferroelectric memory device may further include a plurality of second insulating layers between the plurality of intermediate electrodes.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
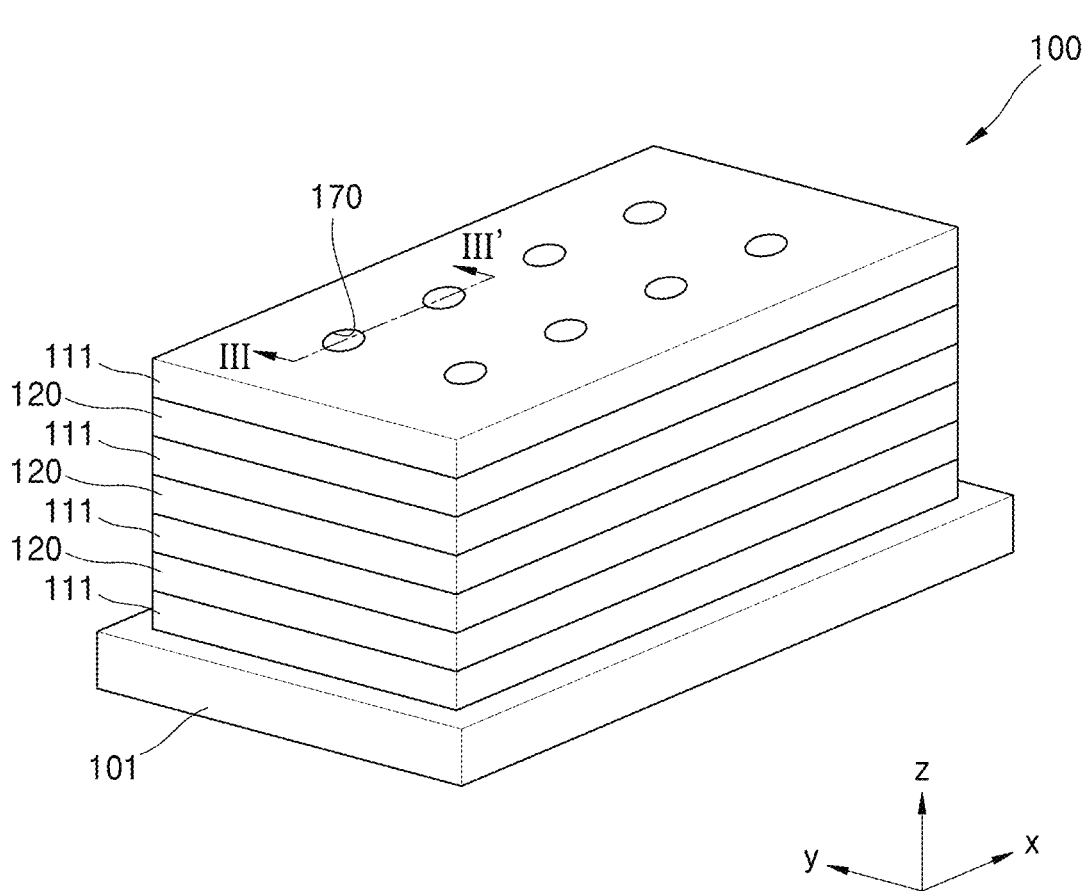
FIG. 1 is a perspective view of a three-dimensional (3D) ferroelectric memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Reference will now be made in detail to embodiments, examples of which are illustrated in the accompanying drawings. In the drawings, like reference numerals refer to like elements throughout and sizes of constituent elements may be exaggerated for convenience of explanation and the clarity of the specification. In this regard, embodiments described herein may have different forms and should not be construed as being limited to the descriptions set forth herein.

It will also be understood that when an element is referred to as being "on" or "above" another element, the element may be in direct contact with the other element or other intervening elements may be present. The singular forms include the plural forms unless the context clearly indicates otherwise. It should be understood that, when a part "comprises" or "includes" an element, unless otherwise defined, other elements are not excluded from the part and the part may further include other elements.

The use of the terms "a" and "an" and "the" and similar referents are to be construed to cover both the singular and the plural. The steps of all methods described herein can be performed in any suitable order unless otherwise indicated herein or otherwise clearly contradicted by context, and are not limited to the described order.

Also, in the specification, the term " . . . units" or " . . . modules" denote units or modules that process at least one function or operation, and may be realized by hardware, software, or a combination of hardware and software.

Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical device.

The use of any and all examples, or example language (e.g., "such as") provided herein, is intended merely to better illuminate the disclosure and does not pose a limitation on the scope of the disclosure unless otherwise claimed.

FIG. 1 is a perspective view of a three-dimensional (3D) ferroelectric memory device 100 according to an embodiment. The 3D ferroelectric memory device 100 illustrate in FIG. 1 may include, for example, a vertical NAND flash memory device.

Referring to FIG. 1, the 3D ferroelectric memory device 100 includes a plurality of memory cells stacked on a surface of a substrate 101 in a substantially perpendicular direction. Here, each memory cell may include a ferroelectric field effect transistor (FeFET) as will be described later.

A vertical stack-type structure in which a first insulating layer 111 and a gate electrode 120 are alternately stacked in a direction substantially perpendicular to a surface of the substrate 101 (z-direction) is provided on the substrate 101. While an example in which one vertical stack-type structure is provided on the substrate 101 is illustrated in FIG. 1, the disclosure is not limited thereto, and a plurality of vertical stack-type structures may be provided and spaced apart from each other on the substrate 101. A plurality of channel holes 170 may be formed in a direction perpendicular to the surface of the substrate 101 in the vertical stack-type structure to pass through the gate electrodes 120 and the first insulating layers 111.

The substrate 101 may include various materials. For example, the substrate 101 may include single-crystal silicon substrate, a compound semiconductor substrate or a silicon on insulator (SOI) substrate. However, these are merely examples, and the substrate 101 of various materials may be used. In addition, the substrate 101 may further include an impurity region formed by doping, an electronic element such as a transistor, or a periphery circuit for selecting and controlling memory cells for storing data.

Figure 2:
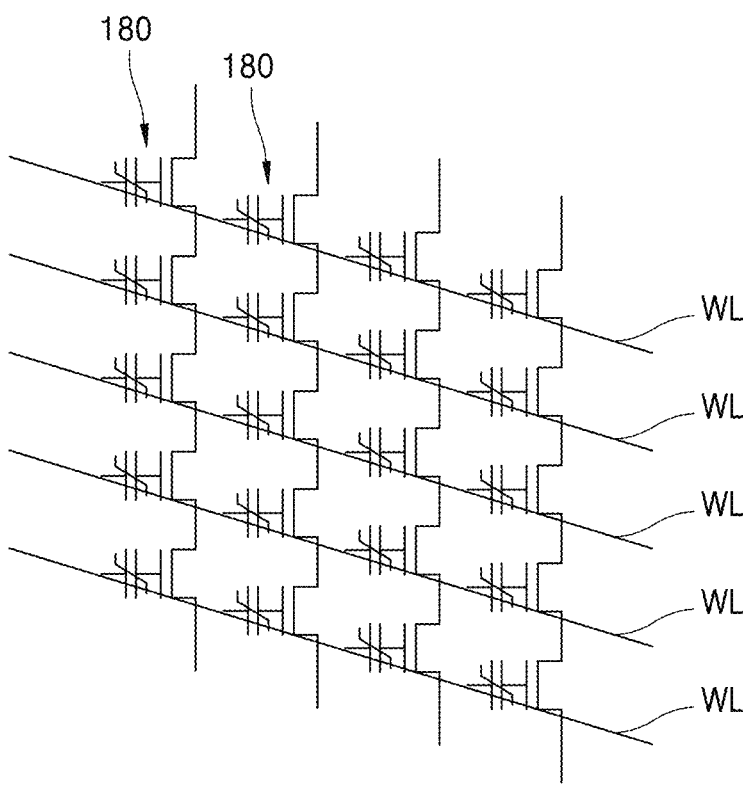
FIG. 2 is an equivalent circuit diagram of a 3D ferroelectric memory device according to an embodiment, illustrated in FIG. 1.

FIG. 2 is an equivalent circuit diagram of the 3D ferroelectric memory device 100 according to an embodiment, illustrated in FIG. 1.

Figure 3:
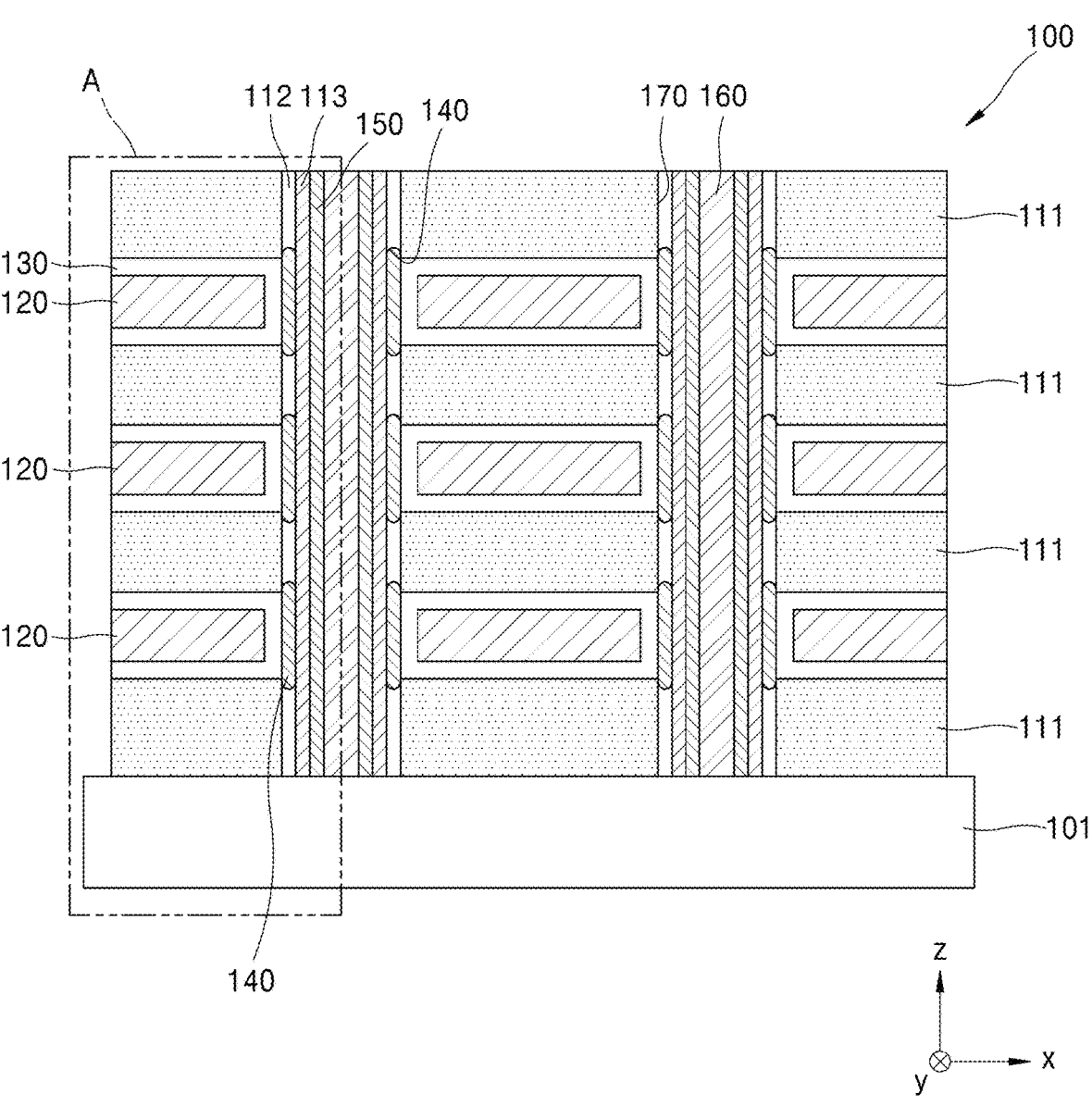
FIG. 3 is a cross-sectional view taken along line III-III' of FIG. 1.

Referring to FIG. 2, a plurality of FeFETs 180 are stacked in a direction perpendicular to the substrate 101, and each FeFET 180 may have a metal ferroelectric metal insulator semiconductor (MFMIS) structure including an intermediate electrode 140 (FIG. 3). The plurality of FeFETs 180 stacked in a direction perpendicular to the substrate 101 are connected in series to each other through sources and drains, and the gate electrodes 120 of the FeFETs 180 arranged in a direction parallel to the substrate 101 are electrically connected to word lines WL.

Figure 4:
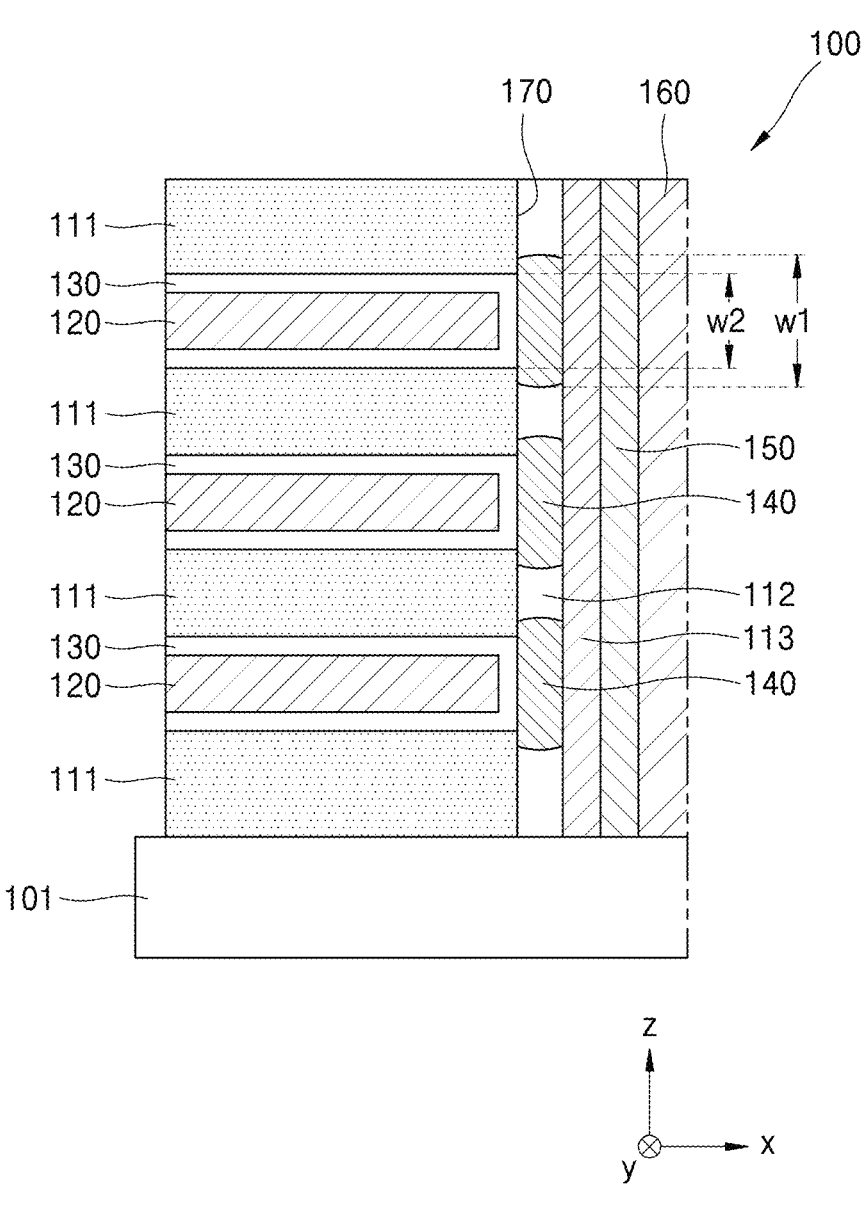
FIG. 4 is an enlarged view of region A of FIG. 3.

FIG. 3 is a cross-sectional view taken along the line III-III' of FIG. 1, and FIG. 4 is an enlarged view of region A of FIG. 3.

Referring to FIGS. 3 and 4, the FeFETs 180 (FIG. 2) having an MFMIS structure are stacked in a direction substantially perpendicular to the substrate 101 (z-direction). Here, each FeFET 180 includes the gate electrode 120, a ferroelectric layer 130, the intermediate electrode 140, a third insulating layer 113 (gate insulating layer), and a channel layer 150.

A plurality of gate electrodes 120 are stacked in a direction perpendicular to the substrate 101, and the first insulating layer 111 is provided between the gate electrodes 120. Here, each gate electrode 120 and each first insulating layer 111 may be provided to extend in a direction substantially parallel to the substrate 101.

The gate electrode 120 may include a conductive material such as metal, metal nitride, metal oxide, polysilicon, or the like. For example, the gate electrode 120 may include at least one of W, TiN, TaN, WN, NbN, Mo, Ru, Ir, RuO, IrO, and polysilicon. However, this is merely an example, and the gate electrode 120 may include other various conductive materials. A thickness of the gate electrode 120 (a thickness in a direction perpendicular to the substrate 101) may be approximately about 5 nm to about 100 nm, but is not limited thereto.

The first insulating layer 111 is for insulation between the gate electrodes 120, and may include, for example, at least one of SiO, SiOC, and SiON. However, the disclosure is not limited thereto. A thickness of the first insulating layer 111 (a thickness in a direction perpendicular to the substrate 101) may be approximately about 7 nm to about 100 nm, but this is merely an example.

Each gate electrode 120 is provided with the ferroelectric layer 130. The ferroelectric layer 130 may be provided on a surface of the gate electrode 120, and may be provided on both surfaces of the gate electrode 120, which are in a direction parallel to the substrate 101, and one side surface of the gate electrode 120, which is in a direction perpendicular to the substrate 101. In other words, the ferroelectric layer 130 may be provided to extend from one side surface of the gate electrode 120 to cover upper and lower surfaces of the gate electrode 120. Upper and lower surfaces of the ferroelectric layer 130 may be in contact with the first insulating layer 111.

A ferroelectric has a spontaneous dipole (electric dipole), that is, spontaneous polarization, because the charge distribution in a unit cell is non-centrosymmetric in a crystallized material structure. In addition, the ferroelectric has a remnant polarization due to the dipole even in the absence of an external electric field. And, in the ferroelectric, a direction of polarization may be switched in units of domains by an external electric field.

The ferroelectric layer 130 may include, for example, a fluorite-based material, a nitride-based material, or perovskite. The nitride-based material may include, for example, AlScN, and the perovskite may include, for example, PZT, $BaTiO_3$, $PbTiO_3$, or the like. However, the disclosure is not limited thereto.

The fluorite-based material may include an oxide of at least one of, for example, Hf, Si, Al, Zr, Y, La, Gd, and Sr. As a detailed example, the ferroelectric layer 130 may include at least one of hafnium oxide (HfO), zirconium oxide (ZrO), and hafnium-zirconium oxide (HfZrO). Hafnium oxide (HfO), zirconium oxide (ZrO), and hafnium-zirconium oxide (HfZrO) constituting the ferroelectric layer 130 may have crystal structure of an orthorhombic crystal system. The ferroelectric layer 130 may further include, for example, at least one dopant selected from among Si, Al, La, Y, Sr, and Gd. A thickness of the ferroelectric layer 130 provided on the gate electrode 120 may be approximately about 3 nm to 20 about nm, but this is merely an example.

One side surface of the ferroelectric layer 130 constitutes an inner wall of the channel hole 170, and the intermediate electrode 140, the third insulating layer 113, the channel layer 150, and an oxide layer 160 are sequentially stacked on the inner wall of the channel hole 170 in a direction parallel to the substrate 101. This will be described in detail below.

Each ferroelectric layer 130 is provided with the intermediate electrode 140. The intermediate electrode 140 may be provided on one side surface of the ferroelectric layer 130 perpendicular to the substrate 101. The intermediate electrode 140 may include a conductive material, like the gate electrode 120. For example, the intermediate electrode 140 may include at least one of W, TiN, TaN, WN, NbN, Mo, Ru, Ir, RuO, IrO, and polysilicon. The intermediate electrode 140 may include a same conductive material as the gate electrode 120, or may include a conductive material different from that of the gate electrode 120.

The intermediate electrode 140 may be provided to extend in a direction perpendicular to the substrate 101 from one side surface of the ferroelectric layer 130. The intermediate electrode 140 may have a width W1 in a direction perpendicular to the substrate 101 and a thickness in a direction parallel to the substrate 101. The width W1 of the intermediate electrode 140 in a direction perpendicular to the substrate 101 may be greater than a width W2 of the ferroelectric layer 130 in contact with the intermediate electrode 140. Accordingly, an area of the intermediate electrode 140 in contact with the third insulating layer 113 to be described later may be larger than an area of the intermediate electrode 140 in contact with the ferroelectric layer 130. Here, a width of the third insulating layer 113 in contact with the intermediate electrode 140 may be substantially equal to the width W1 of the intermediate electrode 140.

For example, when a thickness of the gate electrode 120 is 5 nm and a thickness of the ferroelectric layer 130 is 3 nm, the width W2 of the ferroelectric layer 130 in contact with the intermediate electrode 140 may be about 11 nm. In this case, the width W1 of the intermediate electrode 140 in a direction perpendicular to the substrate 101 may be greater than about 11 nm and less than about 100 nm. As a detailed example, the width W1 of the intermediate electrode 140 in a direction perpendicular to the substrate 101 may be about 15 nm to 100 about nm.

The width W1 of the intermediate electrode 140 in a direction perpendicular to the substrate 101 may be about 1.2 times to about 5 times the width W2 of the ferroelectric layer 130 in contact with the intermediate electrode 140. However, the disclosure is not limited thereto. A thickness of the intermediate electrode 140 in a direction parallel to the substrate 101 may be approximately about 5 nm to about 20 nm, but this is merely an example.

Figure 12:
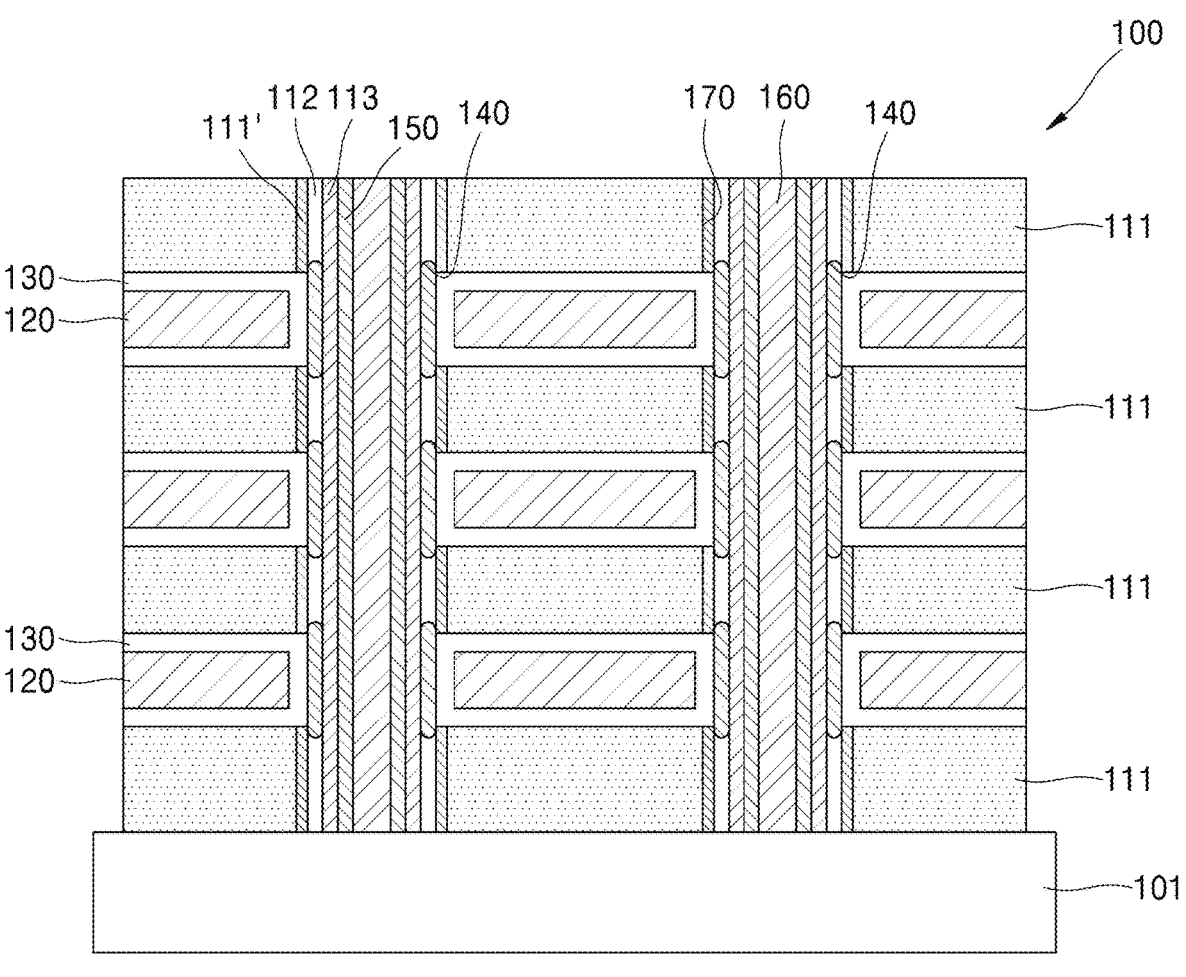

A second insulating layer 112 may be provided between the intermediate electrodes 140. Here, the second insulating layer 112 between the intermediate electrodes 140 may have a width of approximately about 5 nm to about 20 nm in a direction perpendicular to the substrate 101. The intermediate electrode 140 and the second insulating layer 112 may have the same thickness as each other in a direction parallel to the substrate 101. An insulating material layer 111' may be between the second insulating layer 112 and the first insulating layer 111 (see FIG. 12). When the insulating material layer 111' and first insulating layer 111 include the same materials, they may be considered a single structure corresponding the first insulating layer 111 shown in FIGS. 3-4. When the insulating material layer 111' and first insulating layer 111 include different materials, they may be considered as different structures as shown in FIG. 12.

The second insulating layer 112 is for insulation between the intermediate electrodes 140, and may include an insulating material different from that of the first insulating layer 111 described above. For example, the second insulating layer 112 may include SiN, but is not limited thereto.

The third insulating layer 113 is provided on the intermediate electrode 140 and the second insulating layer 112 in a direction perpendicular to the substrate 101. Here, the third insulating layer 113 is a gate insulating layer, and may include, for example, at least one of SiO, SiN, AlO, HfO, and ZrO, but is not limited thereto. The third insulating layer 113 may have a thickness of approximately 1 about nm to about 10 nm, but this is merely an example.

The channel layer 150 is provided on the third insulating layer 113. The channel layer 150 may be provided in a direction perpendicular to the substrate 101 to correspond to the plurality of gate electrodes 120. Accordingly, the plurality of FeFETs 180 vertically stacked on the substrate 101 may share one channel layer 150.

The channel layer 150 may include a semiconductor material. For example, the channel layer 150 may include, for example, a Group IV semiconductor such as Si, Ge, SiGe, or a Group III-V semiconductor. Also, the channel layer 150 may include, for example, an oxide semiconductor, a nitride semiconductor, an oxynitride semiconductor, a two-dimensional (2D) semiconductor material, quantum dots, or an organic semiconductor. Here, the oxide semiconductor may include, for example, InGaZnO, and the like, and the 2D semiconductor material may include, for example, transition metal dichalcogenide (TMD) or graphene, and the quantum dots may include colloidal QDs, a nanocrystal structure and the like. However, this is merely an example, and the present embodiment is not limited thereto.

The channel layer 150 may further include a dopant. Here, the dopant may include a p-type dopant or an n-type dopant. The p-type dopant may include, for example, a Group III element such as B, Al, Ga, In, or the like, and the n-type dopant may include, for example, a Group V element such as P, As, or Sb.

The channel layer 150 may have a thickness of approximately about 1 nm to about 20 nm, but is not limited thereto.

The oxide layer 160 may be further provided in the channel layer 150 to fill the inside of the channel hole 170.

A memory operation may be performed as a ferroelectric polarization direction is determined according to a gate voltage applied to the gate electrode 120 in each FeFET 180. Here, in order to perform a nonvolatile memory operation, a gate voltage higher than a coercive field in which ferroelectric polarization switching occurs may be applied to the gate electrode 120.

In the 3D ferroelectric memory device 100 according to the present embodiment, by providing the intermediate electrode 140 between the ferroelectric layer 130 and the third insulating layer 113, which is a gate insulating layer, and making a width of the intermediate electrode 140 greater than a width of the ferroelectric layer 130, in contact with the intermediate electrode 140, a ratio between capacitance of the ferroelectric layer 130 between the gate electrode 120 and the intermediate electrode 140 and capacitance of the third insulating layer 113 between the intermediate electrode 140 and the channel layer 150 may be adjusted, and accordingly, the reliability of the 3D ferroelectric memory device 100 may be improved.

In the 3D ferroelectric memory device 100, by making the width of the intermediate electrode 140 greater than the width of the ferroelectric layer 130 in contact with the intermediate electrode 140, an area of the intermediate electrode 140 in contact with the third insulating layer 113 may be made larger than an area of the intermediate electrode 140 in contact with the ferroelectric layer 130. Accordingly, as the ratio of the capacitance of the third insulating layer 113 to the capacitance of the ferroelectric layer 130 may be increased, an electric field applied to the third insulating layer 113 may be reduced. Thus, deterioration of the third insulating layer 113 may be limited and/or prevented and the 3D ferroelectric memory device 100 may be easily driven even with a relatively low voltage.

Hereinafter, a method of manufacturing the 3D ferroelectric memory device 100 described above will be described. FIGS. 5 to 12 are diagrams for describing a method of manufacturing a 3D ferroelectric memory device, according to an embodiment.

Figure 5:
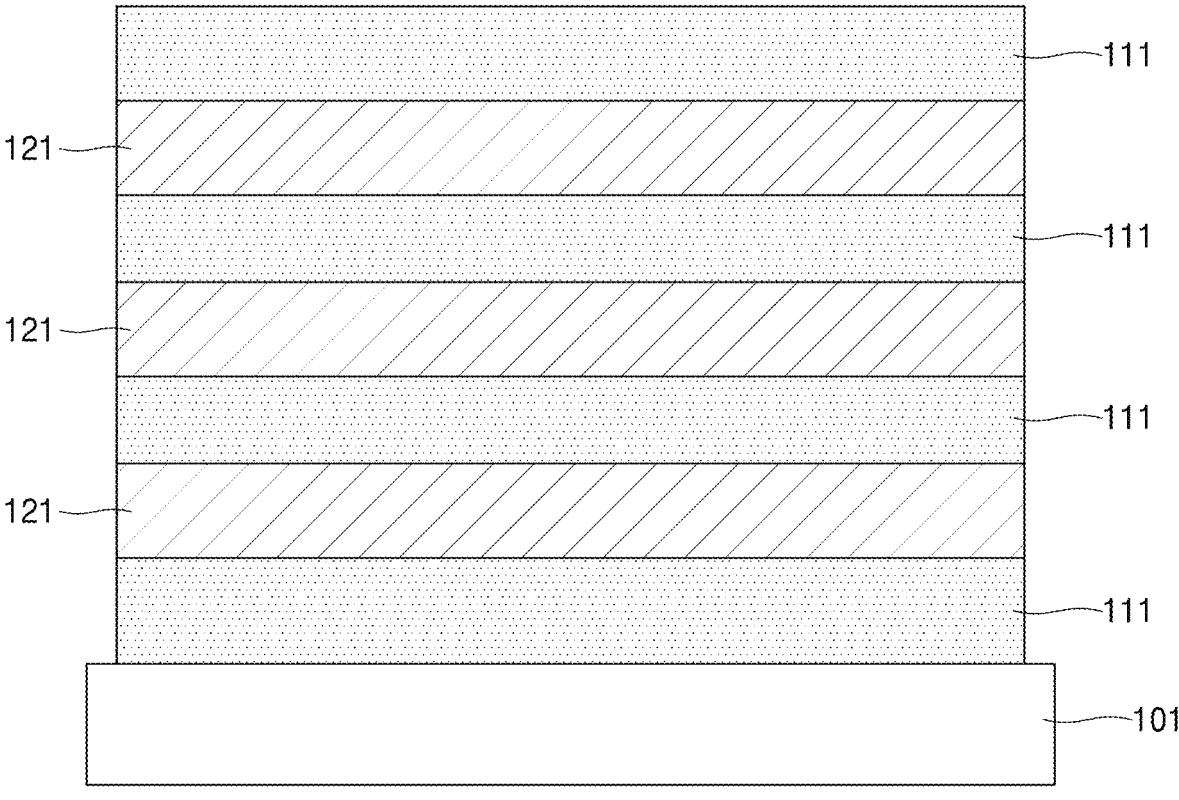
FIGS. 5 to 12 are diagrams for describing a method of manufacturing a 3D ferroelectric memory device, according to an embodiment.

Referring to FIG. 5, a plurality of first insulating layers 111 and a plurality of sacrificial layers 121 are alternately stacked in a direction perpendicular to the substrate 101. The substrate 101 may include various materials. For example, the substrate 101 may include a single-crystal silicon substrate, a compound semiconductor substrate or an SOI substrate. However, these are merely examples, and the substrate 101 of various materials may be used. In addition, the substrate 101 may further include an impurity region formed by doping, an electronic element such as a transistor, or a periphery circuit for selecting and controlling memory cells for storing data.

The first insulating layers 111 may include, for example, at least one of SiO, SiOC, and SiON, but is not limited thereto. The first insulating layers 111 may have a thickness of, for example, about 7 nm to about 100 nm, but this is merely an example. The sacrificial layers 121 may include a material having an etch selectivity to the first insulating layers 111. For example, the sacrificial layers 121 may include SiN, but are not limited thereto.

Figure 6:
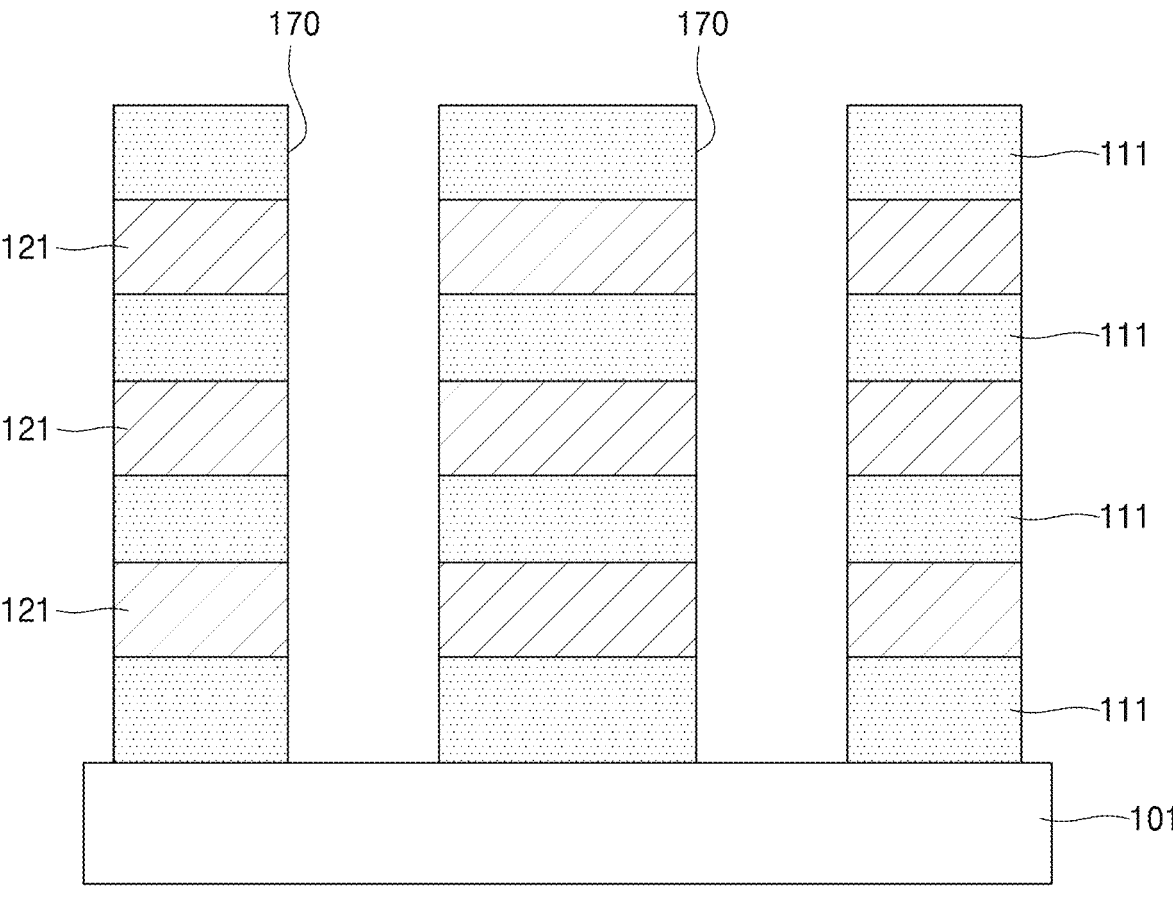

Referring to FIG. 6, channel holes 170 penetrating through the plurality of first insulating layers 111 and the plurality of sacrificial layers 121 are formed. Here, the channel holes 170 may be formed in a direction substantially perpendicular to the substrate 101. Sides of the first insulating layers 111 and the sacrificial layers 121 may be exposed through inner walls of the channel holes 170.

Figure 7:
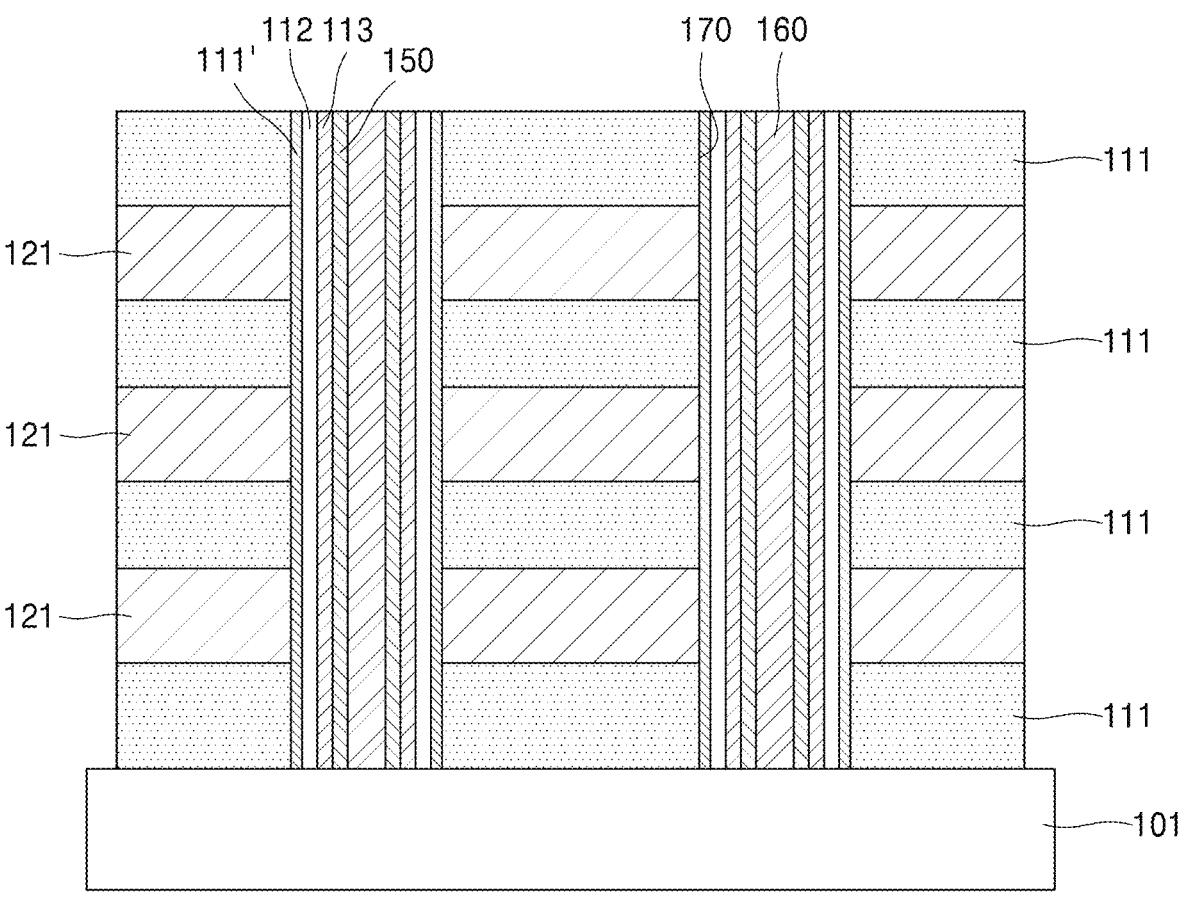

Referring to FIG. 7, an insulating material layer 111', the second insulating layer 112, the third insulating layer 113, and the channel layer 150 are sequentially deposited on the inner walls of the channel holes 170. The insulating material layer 111' deposited on the inner walls of the channel holes 170 may include the same insulating material as the first insulating layers 111. However, the disclosure is not limited thereto. For example, the insulating material layer 111' may include at least one of SiO, SiOC, and SiON.

The second insulating layer 112 may be formed on the insulating material layer 111'. The second insulating layer 112 may include an insulating material having an etch selectivity to the first insulating layers 111 and the insulating material layer 111'. For example, the second insulating layer 112 may include SiN, but is not limited thereto. The second insulating layer 112 may have a thickness of approximately about 5 nm to about 20 nm, but this is merely an example.

The third insulating layer 113 may be formed on the second insulating layer 112. The third insulating layer 113 is a gate insulating layer, and may include, for example, at least one of SiO, SiN, AlO, HfO, and ZrO. The third insulating layer 113 may have a thickness of approximately about 1 nm to about 10 nm. However, this is merely an example.

The channel layer 150 may be formed on the third insulating layer 113. The channel layer 150 may include a semiconductor material. For example, the channel layer 150 may include, for example, a Group IV semiconductor such as Si, Ge, SiGe, or a Group III-V semiconductor. Also, the channel layer 150 may include, for example, an oxide semiconductor, a nitride semiconductor, an oxynitride semiconductor, a 2D semiconductor material, quantum dots, or an organic semiconductor. Here, the oxide semiconductor may include, for example, InGaZnO, and the like, and the 2D semiconductor material may include, for example, transition metal dichalcogenide (TMD) or graphene, and the quantum dots may include colloidal QDs, a nanocrystal structure and the like. However, this is merely an example, and the present embodiment is not limited thereto.

The channel layer 150 may further include a dopant. Here, the dopant may include a p-type dopant or an n-type dopant. The p-type dopant may include, for example, a Group III element such as B, Al, Ga, In, or the like, and the n-type dopant may include, for example, a Group V element such as P, As, or Sb. The channel layer 150 may have a thickness of approximately about 1 nm to about 20 nm, but is not limited thereto. The oxide layer 160 may be further formed in the channel layer 150 to fill the inside of the channel holes 170.

Figure 8:
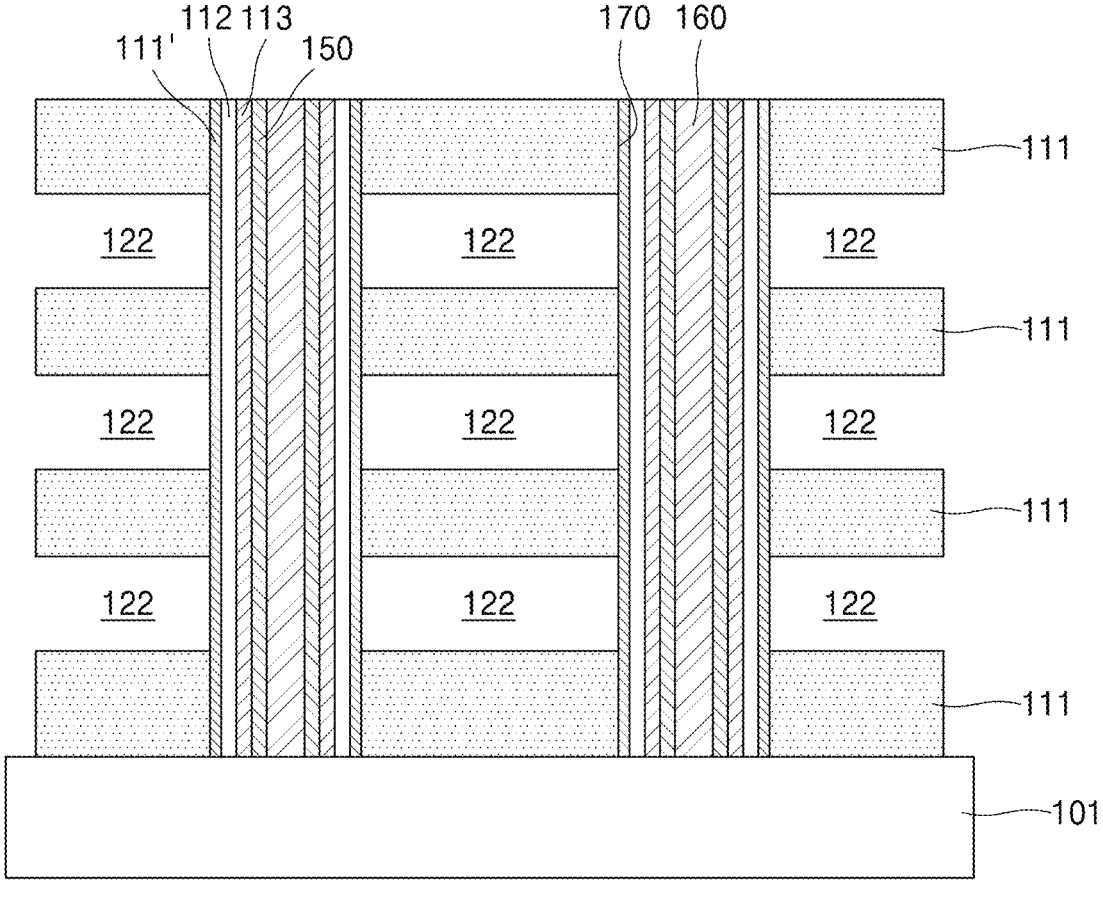
Figure 9:
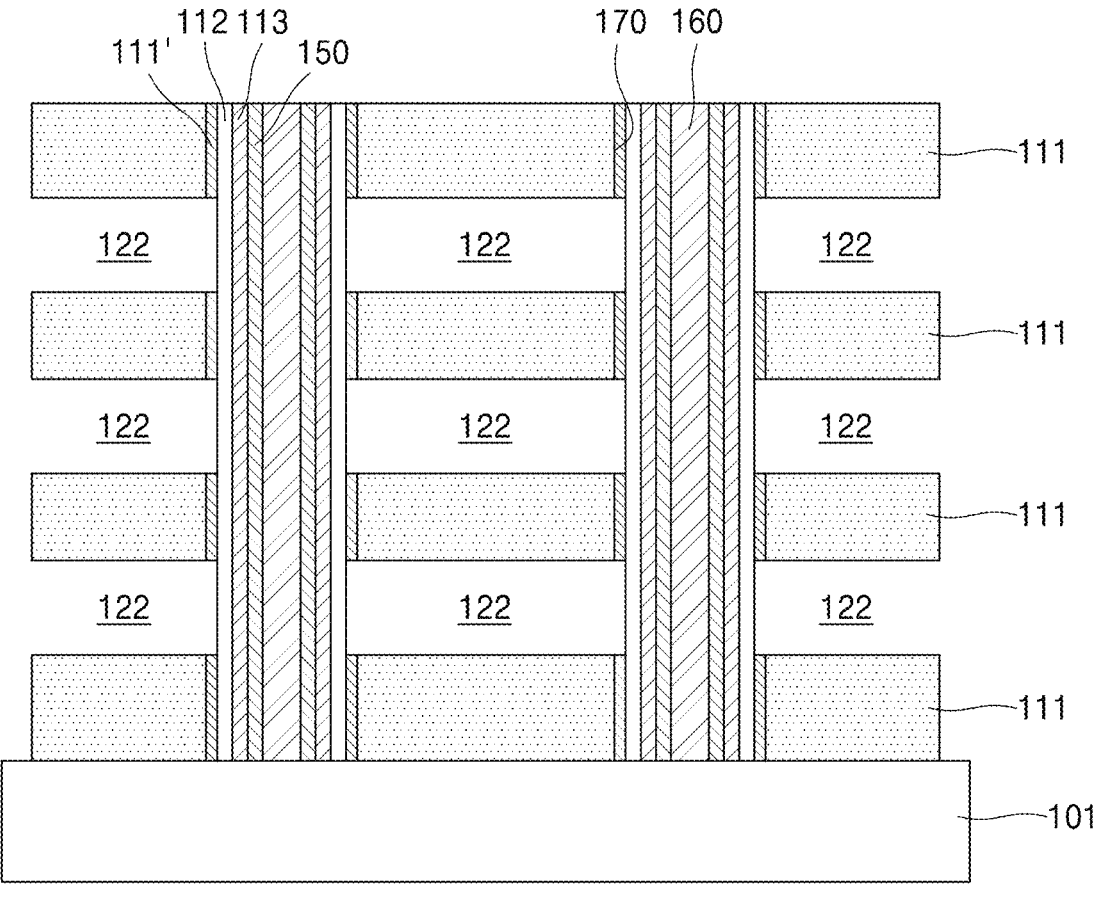

Referring to FIG. 8, the sacrificial layers 121 are etched to be removed. Accordingly, the insulating material layer 111' is exposed through a space 122 obtained by removing the sacrificial layers 121. Next, referring to FIG. 9, the insulating material layer 111' exposed through the space 122 obtained by removing the sacrificial layers 121 is etched to be removed. Accordingly, the second insulating layer 112 is exposed through the space 122 obtained by removing the sacrificial layers 121.

Figure 10:
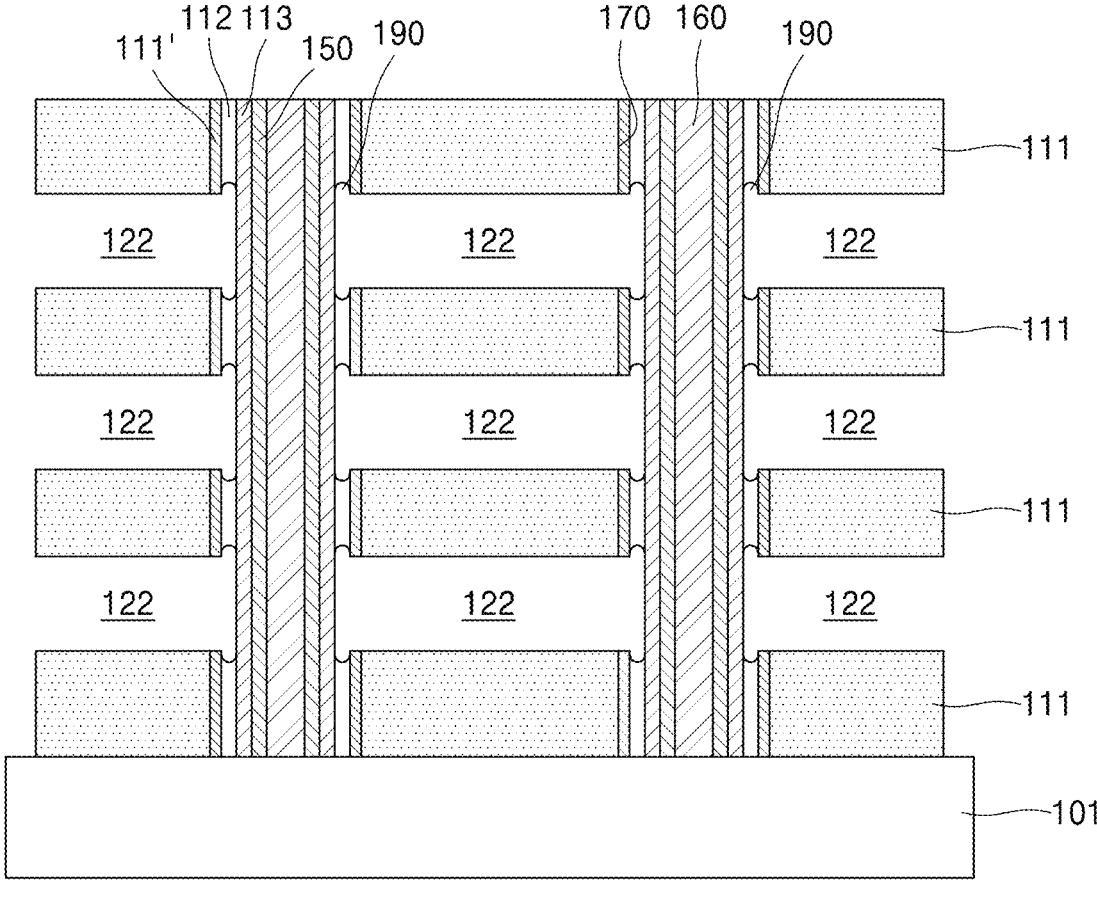

Referring to FIG. 10, the second insulating layer 112 exposed through the space 122 obtained by removing the sacrificial layers 121 is formed to form a recess 190. Here, the recess 190 may extend in a direction perpendicular to the substrate 101. Accordingly, a width of the recess 190 in a direction perpendicular to the substrate 101 may be greater than a width of the space 122 obtained by removing the sacrificial layers 121. For example, the width of the recess 190 in a direction perpendicular to the substrate 101 may be about 1.2 times to about 5 times a width of the space 122 obtained by removing the sacrificial layers 121. However, this is merely an example.

Figure 11:
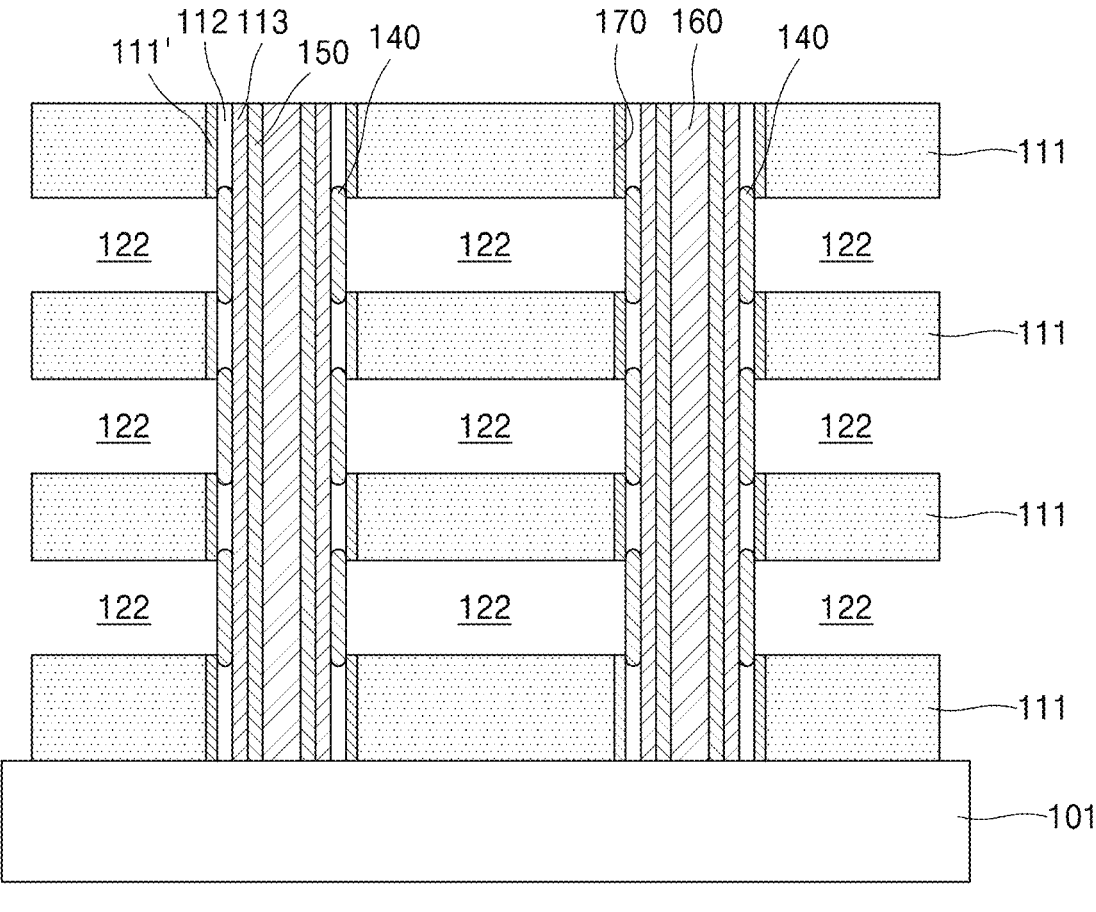

Referring to FIG. 11, the intermediate electrode 140 is deposited to fill the inside of the recess 190 formed by etching the second insulating layer 112. Thus, the width of the intermediate electrode 140 in a direction perpendicular to the substrate 101 may be greater than the width of the space 122 obtained by removing the sacrificial layers 121. The intermediate electrode 140 may include at least one of W, TiN, TaN, WN, NbN, Mo, Ru, Ir, RuO, IrO, and polysilicon, but is not limited thereto. The intermediate electrode 140 may have a same thickness as that of the second insulating layer 112.

Referring to FIG. 12, the ferroelectric layer 130 is deposited on an inner wall of the space 122 obtained by removing the sacrificial layers 121, and then the gate electrode 120 is formed in an inner portion of the ferroelectric layer 130.

The ferroelectric layer 130 may include, for example, a fluorite-based material, a nitride-based material, or perovskite. The nitride-based material may include, for example, AlScN, and the perovskite may include, for example, PZT, $BaTiO_3$, $PbTiO_3$, or the like. However, the disclosure is not limited thereto.

The fluorite-based material may include an oxide of at least one of, for example, Hf, Si, Al, Zr, Y, La, Gd, and Sr. As a detailed example, the ferroelectric layer 130 may include at least one of hafnium oxide (HfO), zirconium oxide (ZrO), and hafnium-zirconium oxide (HfZrO). Hafnium oxide (HfO), zirconium oxide (ZrO), and hafnium-zirconium oxide (HfZrO) constituting the ferroelectric layer 130 may have crystal structure of an orthorhombic crystal system. The ferroelectric layer 130 may further include, for example, at least one dopant selected from among Si, Al, La, Y, Sr, and Gd. A thickness of the ferroelectric layer 130 provided on the gate electrode 120 may be approximately about 3 nm to about 20 nm, but this is merely an example.

The gate electrode 120 is formed in the inner portion of the ferroelectric layer 130. The gate electrode 120 may include at least one of, for example, W, TiN, TaN, WN, NbN, Mo, Ru, Ir, RuO, IrO, and polysilicon. However, this is merely an example. A thickness of the gate electrode 120 (a thickness in a direction perpendicular to the substrate 101) may be approximately about 5 nm to about 100 nm, but is not limited thereto.

Figure 13:
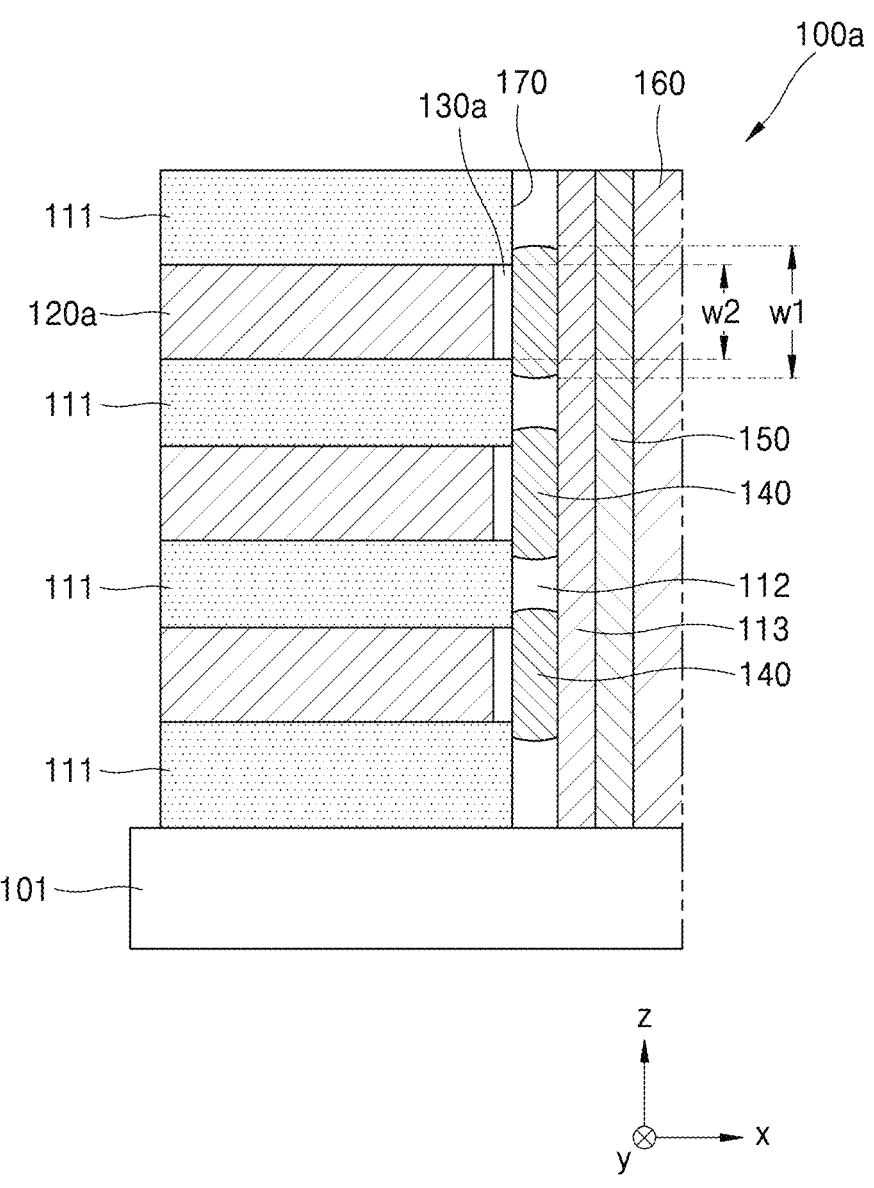
FIG. 13 is a cross-sectional view of a 3D ferroelectric memory device according to an embodiment.

FIG. 13 is a cross-sectional view of a 3D ferroelectric memory device according to an embodiment.

Referring to FIG. 13, a 3D ferroelectric memory device 100a may be the same as the 3D ferroelectric memory device 100 in FIGS. 3-4, except the gate electrodes 120a and ferroelectric layers 130a may be different compared to the 3D ferroelectric memory device 100 in FIGS. 3-4. In the 3D ferroelectric memory device 100a, the ferroelectric layer 130a may only cover a side surface of the gate electrode 120a. The ferroelectric layer 130a may be between the intermediate electrode 140 and a side surface of the gate electrode 120a facing the intermediate electrode 140. An upper surface of the gate electrode 120a may contact a lower surface of the first insulating layer 111 overlying the gate electrode 120a. A lower surface of the gate electrode 120a may contact an upper surface of the first insulating layer 111 underlying the gate electrode 120a. A lower surface of the lowermost gate electrode 120a may contact an upper surface of the substrate 101 instead of an upper surface of a first insulating layer 111.

Figure 14:
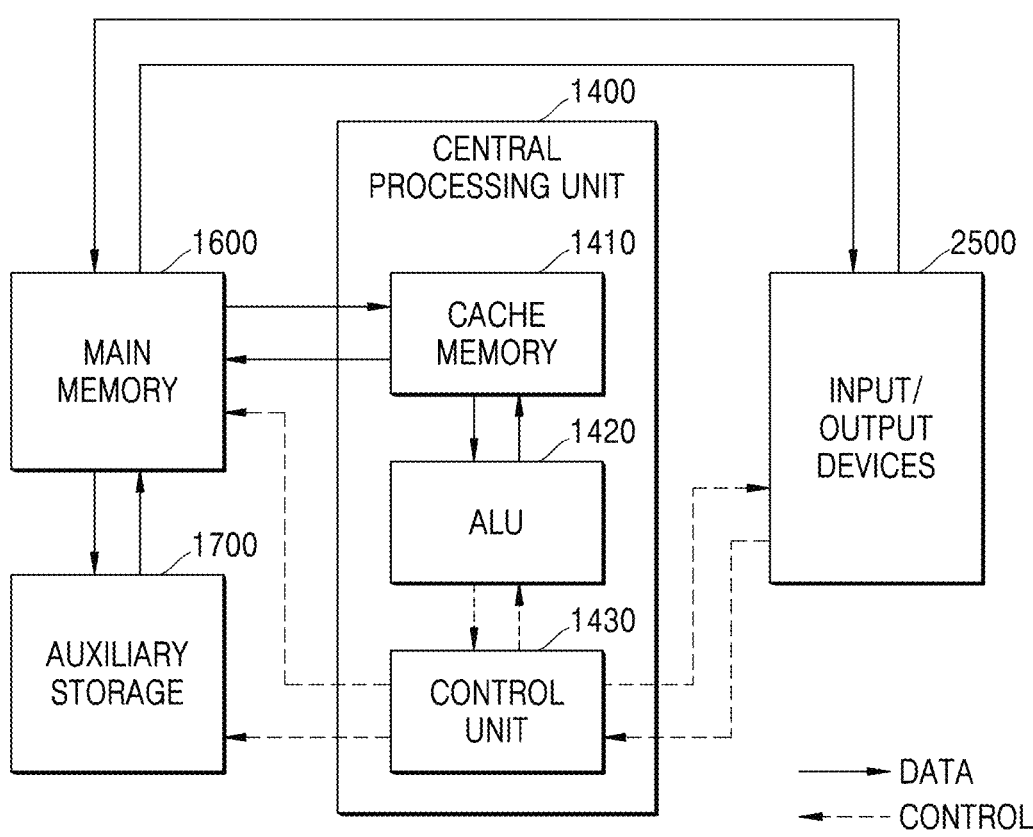
FIG. 14 is a schematic conceptual diagram of a device architecture applicable to an electronic device, according to an embodiment.

The 3D ferroelectric memory devices 100 and 100a described above may be used for data storage in various electronic devices. FIG. 14 is a schematic conceptual diagram of a device architecture applicable to an electronic device, according to embodiments.

Referring to FIG. 14, a cache memory 1410, an arithmetic logic unit (ALU) 1420, and a control unit 1430 may constitute a central processing unit (CPU) 1400, and the cache memory 1410 may include static random access memory (SRAM). Separately from the CPU 1400, a main memory 1600 and an auxiliary storage 1700 may be provided. The main memory 1600 may include a DRAM device, and an auxiliary storage 1700 may include the 3D ferroelectric memory device 100 or 100a described above. In some cases, a device architecture may be implemented in a form in which computing unit devices and memory unit devices are adjacent to each other in one chip without any distinction between sub-units.

In the 3D ferroelectric memory device according to the above embodiments, by making a width of an intermediate electrode greater than a width of a ferroelectric layer that is in contact with the intermediate electrode, an area of the intermediate electrode that is in contact with a gate insulating layer may be made larger than an area of the intermediate electrode that is in contact with the ferroelectric layer. Accordingly, as a ratio of capacitance of the gate insulating layer to capacitance of the ferroelectric layer may be increased, an electric field applied to the gate insulating layer may be reduced. Accordingly, deterioration of the gate insulating layer may be limited and/or prevented and the 3D ferroelectric memory device may be easily driven even with a relatively low voltage.

Figure 15:
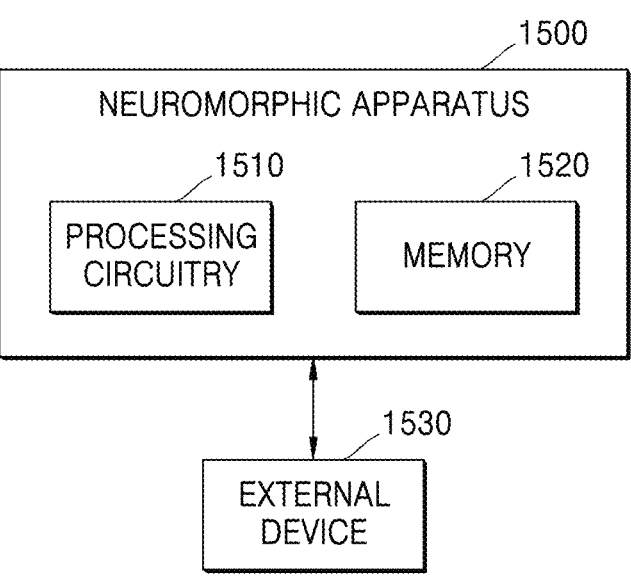
FIG. 15 is a diagram of a neuromorphic apparatus and an external device connected thereto in accordance with some example embodiments.

FIG. 15 is a diagram of a neuromorphic apparatus and an external device connected thereto in accordance with some example embodiments.

Referring to FIG. 15, a neuromorphic apparatus 1500 may include processing circuitry 1510 and/or a memory 1520. The processing circuitry 1510 may include a hardware such as a logic circuit, a hardware/software combination such as a processor configured to execute software, or a combination thereof. For example, the processor may include a CPU, a graphics processing unit (GPU), an application processor (AP) included in the neuromorphic apparatus 1500, an ALU, a digital signal processor, a microcomputer, a FPGA, a SoC, a programmable logic unit, a microprocessor, and an ASIC, but is not limited thereto. The neuromorphic apparatus 1500 may include a memory based on the 3D ferroelectric memory devices 100 and 100a described above.

In some example embodiments, the processing circuitry 1510 may read/write various data with respect to an external device 1530, and/or may be configured to execute the neuromorphic apparatus 1500 using the read/written data. In some embodiments, the external device 1530 may include an external memory and/or a sensor array, each having an image sensor (for example, a complementary metal-oxide-semiconductor (CMOS) image sensor circuit).

In some example embodiments, the processing circuitry 1510 may be configured to control a function for driving the neuromorphic apparatus 1500. For example, the processing circuitry 1510 may be configured to control the neuromorphic apparatus 1500 by executing a program stored in the memory 1520.

In some embodiments, the neuromorphic apparatus 1500 may be applied to a machine learning system. The machine learning system may use various artificial neural network organizing and processing models such as a convolutional neural network (CNN), a deconvolutional neural network, a recurrent neural network (RNN) including a long short-term memory (LSTM) unit and/or a gated recurrent unit (GRU), a stacked neural network (SNN), a state-space dynamic neural network (SSDNN), a deep faith network (DBN), a generative adversarial network, and/or a restricted Boltzmann machine (RBM).

Alternatively, or additionally, the machine learning system may include other forms of machine learning models, for example, linear and/or logistic regression, statistical clustering, Bayesian classification, decision tree, dimensionality reduction such as principal component analysis, an expert system, and/or a combination thereof including ensembles such as random forests. These machine learning models may be used to provide various services and/or applications. For example, an image classification service, a user authentication service based on biometrics or biometric data, an advanced driver assistance system (ADAS), a voice assistant service, or an automatic speech recognition (ASR) service may be executed by an electronic device.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense merely and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A three-dimensional (3D) ferroelectric memory device comprising:
 a substrate;
 a plurality of gate electrodes stacked on the substrate;
 a plurality of ferroelectric layers in contact with the plurality of gate electrodes;
 a plurality of intermediate electrodes in contact with the plurality of ferroelectric layers;
 a gate insulating layer in contact with the plurality of intermediate electrodes;
 a plurality of first insulating layers between the plurality of gate electrodes; and
 a channel layer in contact with the gate insulating layer, wherein widths of the plurality of intermediate electrodes are greater than widths of the plurality of ferroelectric layers in contact with the plurality of intermediate electrodes, wherein
 the plurality of first insulating layers and the plurality of gate electrodes are alternately arranged over the substrate with the plurality of ferroelectric layers separating the plurality of first insulating layers and the plurality of gate electrodes from each other, respectively, and
 wherein the plurality of first insulating layers are spaced apart from the gate insulating layer.

2. The 3D ferroelectric memory device of claim 1, wherein
 the plurality of gate electrodes are stacked in a direction perpendicular to a surface of the substrate, and
 each of the plurality of gate electrodes extend in a direction parallel to the surface of the substrate.

3. The 3D ferroelectric memory device of claim 2, wherein
 the plurality of ferroelectric layers are on upper surfaces of the plurality of gate electrodes and lower surfaces of the plurality of gate electrodes, respectively,
 the upper surfaces of the plurality of gate electrodes and the lower surfaces of the plurality of gate electrodes are parallel to the surface of the substrate,
 the plurality of gate electrodes include first side surfaces and second side surfaces that are different from each other,
 the plurality of ferroelectric layers are on the first side surfaces of the plurality of gate electrodes, and p1 the first side surfaces are perpendicular to the surface of the substrate.

4. The 3D ferroelectric memory device of claim 1, wherein areas of the plurality of ferroelectric layers in contact with the plurality of intermediate electrodes are less than areas of the gate insulating layer in contact with the plurality of intermediate electrodes.

5. The 3D ferroelectric memory device of claim 1, wherein the widths of the plurality of intermediate electrodes are about 1.2 times to about 5 times the widths of the plurality of ferroelectric layers in contact with the plurality of intermediate electrodes.

6. The 3D ferroelectric memory device of claim 5, wherein the widths of the plurality of intermediate electrodes are about 15 nm to about 100 nm.

7. The 3D ferroelectric memory device of claim 1, wherein each of the plurality of gate electrodes and each of the plurality of intermediate electrodes independently include at least one of W, TiN, TaN, WN, NbN, Mo, Ru, Ir, RuO, IrO, and polysilicon.

8. The 3D ferroelectric memory device of claim 1, wherein the plurality of first insulating layers comprise at least one of SiO, SiOC, and SiON.

9. The 3D ferroelectric memory device of claim 1, wherein the plurality of first insulating layers have thicknesses of about 7 nm to about 100 nm.

10. The 3D ferroelectric memory device of claim 1, wherein the plurality of ferroelectric layers comprise a fluorite-based material, a nitride-based material, or perovskite.

11. The 3D ferroelectric memory device of claim 1, wherein the plurality of ferroelectric layers have thicknesses of about 3 nm to about 20 nm.

12. The 3D ferroelectric memory device of claim 1, further comprising:
 a plurality of second insulating layers between the plurality of intermediate electrodes,
 wherein insulating materials of the plurality of second insulating layers and the plurality of first insulating layers are different from each other.

13. The 3D ferroelectric memory device of claim 1, further comprising:
 a plurality of second insulating layers between the plurality of intermediate electrodes, wherein the plurality of second insulating layers comprise SiN.

14. The 3D ferroelectric memory device of claim 1, further comprising:

a plurality of second insulating layers between the plurality of intermediate electrodes, wherein widths of the plurality of second insulating layers are about 5 nm to about 20 nm.

15. The 3D ferroelectric memory device of claim 1, wherein the gate insulating layer comprises at least one of SiO, SiN, AlO, HfO, and ZrO.

16. The 3D ferroelectric memory device of claim 1, wherein the channel layer commonly corresponds to the plurality of gate electrodes.

17. The 3D ferroelectric memory device of claim 16, wherein the channel layer extends in a direction perpendicular to a surface of the substrate.

18. The 3D ferroelectric memory device of claim 16, wherein the channel layer comprises a Group IV semiconductor, a Group III-V semiconductor, an oxide semiconductor, a nitride semiconductor, an oxynitride semiconductor, a two-dimensional (2D) semiconductor material, quantum dots, or an organic semiconductor.

19. A three-dimensional (3D) ferroelectric memory device comprising:

a substrate;

a plurality of gate electrodes stacked on the substrate;

a plurality of ferroelectric layers in contact with the plurality of gate electrodes;

a plurality of intermediate electrodes in contact with the plurality of ferroelectric layers;

a gate insulating layer in contact with the plurality of intermediate electrodes;

a plurality of insulating layers between the plurality of intermediate electrodes such that the plurality of insulating layers and the plurality of intermediate electrodes are alternately arranged in a direction vertical to the substrate; and a channel layer in contact with the gate insulating layer, wherein widths of the plurality of intermediate electrodes are greater than widths of the plurality of ferroelectric layers in contact with the plurality of intermediate electrodes.

20. The 3D ferroelectric memory device of claim 19, wherein areas of the plurality of ferroelectric layers in contact with the plurality of intermediate electrodes are less than areas of the gate insulating layer in contact with the plurality of intermediate electrodes.

* * * * *